(12) United States Patent
Bollenbeck et al.

(10) Patent No.: US 9,897,671 B2
(45) Date of Patent: Feb. 20, 2018

(54) DETUNING APPARATUS FOR A RECEIVE COIL FOR A MAGNETIC RESONANCE DEVICE INCLUDING A NUMBER OF COIL ELEMENTS

(75) Inventors: Jan Bollenbeck, Eggolsheim (DE); Klaus Porzelt, Nürnberg (DE); Wilfried Schnell, Forchheim (DE)

(73) Assignee: Siemens Aktiengesellschaft, München (DE)

( * ) Notice: Subject to any disclaimer, the term of this patent is extended or adjusted under 35 U.S.C. 154(b) by 1539 days.

(21) Appl. No.: 13/605,928

(22) Filed: Sep. 6, 2012

(65) Prior Publication Data

US 2013/0241556 A1    Sep. 19, 2013

(30) Foreign Application Priority Data

Sep. 7, 2011   (DE) .................. 10 2011 082 256

(51) Int. Cl.
 *G01R 33/3415*   (2006.01)
 *G01R 33/36*   (2006.01)

(52) U.S. Cl.
 CPC ..... *G01R 33/3664* (2013.01); *G01R 33/3415* (2013.01); *G01R 33/3657* (2013.01)

(58) Field of Classification Search
 USPC .......................... 324/300–322; 600/407–435; 382/128–131; 340/10.1
 See application file for complete search history.

(56) References Cited

U.S. PATENT DOCUMENTS

| 6,606,513 B2 * | 8/2003 | Lardo | G01R 33/285 324/318 |
| 7,551,953 B2 * | 6/2009 | Lardo | G01R 33/285 600/411 |

(Continued)

FOREIGN PATENT DOCUMENTS

| DE | 10 2007 053 429 A1 | 5/2009 |
| DE | 10 2010 027 673 A1 | 1/2012 |

OTHER PUBLICATIONS

German Office Action dated Jun. 14, 2012 for corresponding German Patent Application No. DE 10 2011 082 256.9 with English translation.

*Primary Examiner* — Melissa Koval
*Assistant Examiner* — Tiffany Fetzner
(74) *Attorney, Agent, or Firm* — Lempia Summerfield Katz LLC

(57) ABSTRACT

A detuning apparatus for a receive coil for a magnetic resonance device includes a number of coil elements. The coil elements may be selectively connected to a receive channel of a data processing apparatus by way of a switching apparatus. Each of the coil elements includes at least one detuning assembly such as, for example, a PIN diode that may be switched between a detuning state and a receive state by way of a continuous switching signal. A controller is provided to switch the switching apparatus and to generate the switching signals. The detuning apparatus has first diplexers connected upstream of the switching apparatus for injecting switching signals for switching the detuning (Continued)

assembly for coil elements to be detuned dynamically. The detuning apparatus also includes detuning modules for each of the coil elements to switch the detuning assembly to the detuning state if there is no switching signal present.

20 Claims, 4 Drawing Sheets

(56) References Cited

U.S. PATENT DOCUMENTS

| | | | | |
|---|---|---|---|---|
| 7,876,097 | B2 | 1/2011 | Greim | 324/318 |
| 7,924,007 | B2 * | 4/2011 | Arnold | G01R 33/3415 |
| | | | | 324/309 |
| 8,749,238 | B2 * | 6/2014 | Biber | G01R 33/3621 |
| | | | | 324/318 |
| 8,810,371 | B2 * | 8/2014 | Murdoch | G06K 7/10346 |
| | | | | 340/10.1 |
| 2001/0056232 | A1 * | 12/2001 | Lardo | G01R 33/285 |
| | | | | 600/423 |
| 2004/0199071 | A1 * | 10/2004 | Lardo | G01R 33/285 |
| | | | | 600/423 |
| 2008/0211502 | A1 * | 9/2008 | Arnold | G01R 33/3415 |
| | | | | 324/318 |
| 2011/0121945 | A1 * | 5/2011 | Murdoch | G06K 7/10346 |
| | | | | 340/10.1 |
| 2012/0187949 | A1 | 7/2012 | Biber et al. | 324/322 |
| 2013/0241556 | A1 * | 9/2013 | Bollenbeck | G01R 33/3415 |
| | | | | 324/322 |

* cited by examiner

DETUNING APPARATUS FOR A RECEIVE COIL FOR A MAGNETIC RESONANCE DEVICE INCLUDING A NUMBER OF COIL ELEMENTS

This application claims the benefit of DE 10 2011 082 256.9, filed on Sep. 7, 2011.

BACKGROUND

The present embodiments relate to a detuning apparatus for a receive coil for a magnetic resonance device.

Magnetic resonance imaging is known in the prior art. Magnetic resonance imaging uses coil elements of a transmit coil to excite nuclear spins in a target object (e.g., a certain layer of the target object). The resulting magnetic resonance signals may be received by coil elements of at least one receive coil that are resonant at this frequency to allow receipt. During transmission by way of the transmit coil, coil elements of the receive coil are held in a detuned state, so that the transmit signal is not injected at the coil elements, having a negative impact in the process. A detuning assembly (e.g., a PIN diode) is provided in the coil element, by way of which the coil element may be dynamically detuned at least during the transmit process.

Increasingly frequent use is made of receive coils that have a large number of coil elements, not all of which are to be read out or may be read out for a measurement. A switching apparatus connects receive coil elements to be read out to corresponding receive channels of a data processing device (e.g., an evaluation device). Coil elements may be connected to receive channels in any manner. If, for example, due to the technically limited size of the homogeneity volume of the magnetic resonance device, a magnetic resonance examination is performed in a number of acts, in which different regions of the target object are recorded, only the coil elements that are intended to receive in the region being examined in each instance, dynamically between a resonant receive state and a non-resonant detuning state (e.g., during the transmit phase with the transmit coil), may be switched during a sequence. Other coil elements that are not contributing to the imaging process at the time may be statically detuned.

Different options are known in the prior art for specifically achieving such a detuning capacity. Three of the options are set out in more detail below.

In one embodiment, each coil element of the receive coil may have a cross-connected diode pair that blocks in the receive instance (e.g., at very low power) and becomes low-resistance in the high-frequency transmit instance (e.g., at very high high-frequency power). Such idling or short circuit is used by way of a quarter lambda line to tune or detune the receive element. This solution is disadvantageous in that at low transmit powers in some circumstances the diodes do not become completely low-resistance. The precise high-frequency transmit level, at which the transition takes place from a non-conducting to a conducting state of the diodes, also is a function of the location, size and charge of the receive coil. It may therefore occur that the receive element is not detuned in time and therefore influences the homogeneity of the high-frequency transmit field that may result in reduced image quality.

In another embodiment, each receive coil element is provided with a PIN diode that is connected by an appropriate line to a controlled current/voltage source. The current/voltage source allows the PIN diode to be switched to a low-resistance or high-resistance state. The high-resistance state, which is present when a voltage of, for example, 40 V is applied, may be used for the receive process, since the noise is much lower than in a state in which current of, for example, 30 mA flows through the PIN diode. This state is used as the detuning state. To detune the PIN diode, therefore, a certain current flow is required. The required current flow may also be supplied by the current/voltage source.

The coil elements used for receiving during a measurement may be dynamically tuned and detuned. This is done using a shared dynamic activation signal, by way of which the current/voltage sources are dynamically activated. Static detuning is maintained for the coil elements, which are not to be used to receive magnetic resonance signals (e.g., the current/voltage sources do not respond to the dynamic control signal). The current/voltage sources may have a further control input, for example, that is additionally activated via a controller. A register may be provided as, for example, part of a controller that establishes whether a current/voltage source responds to the dynamic signal and which coil elements are connected by way of the switching apparatus to the data processing apparatus so that the data processing apparatus may evaluate the receive signal.

In this embodiment, the current/voltage sources are disposed outside the examination volume (e.g., outside the receive coil on the main magnet unit or in a technical area). This has two disadvantages. The electric power required to switch the PIN diode is to be transmitted via a connecting line between the current/voltage source and the PIN diode, so that corresponding requirements result for the connecting lines with respect to cross-sectional design, impedance, blocking and the like. A separate connecting line is used for every PIN diode to be controlled.

The choice of which coil elements are switched to which receive channels and which PIN diodes are detuned statically or dynamically is made separately in each instance and forwarded. The switchable current/voltage sources and the switches of the switching apparatus are each activated via separate control lines, making the system extremely complex.

To simplify the system, the cabling (e.g., separate cables previously used for the high-frequency receive signals and the PIN diode activation signals) was reduced by transmitting the signals at least to some extent on a shared line using frequency multiplexing. The activation signals for the PIN diodes after the switching apparatus are also forwarded onto the lines to the coil elements. The magnetic resonance receive signal may have a frequency that is >5 MHz, but the PIN activation signal is a switching signal with a switching time of approximately 10 µs.

In yet another embodiment, in contrast to the embodiment above, the current/voltage source is not provided outside the examination volume but is provided directly on the coil element. Since this is extremely close to the object to be examined (e.g., a patient), the current/voltage source is to be small and designed with as little power loss as possible. For example, a high negative supply voltage (e.g., −40 V) as the voltage source and a lower positive supply voltage (e.g., 5 V) with a correspondingly dimensioned pre-resistor as the current source may be switched between. This arrangement has the advantage that the energy used to switch the PIN diode may not be transmitted by way of the sometimes very long connecting lines. Only a logic signal may run on the line.

In addition to the arrangements described here, further solutions that have not found their way into an actual product (e.g., detuning by way of an auxiliary carrier that is emitted using the whole-body antenna, or detuning via an optically controlled semiconductor switch that is switched by the measurement controller via a glass fiber) are known. These methods are technically difficult to implement.

SUMMARY AND DESCRIPTION

The present embodiments may obviate one or more of the drawbacks or limitations in the related art. For example, the complexity of a detuning apparatus with respect to the cabling and activation outlay is reduced.

In one embodiment, a detuning apparatus includes first diplexers connected upstream of a switching apparatus for injecting switching signals for coil elements to be detuned dynamically. The detuning apparatus also includes detuning modules for each coil element to switch the detuning assembly to the detuning state if there is no switching signal present.

According to one embodiment, the switching signal for the detuning assembly may also be switched by way of the switching apparatus (e.g., the receive selection apparatus) by using a frequency multiplexer that, for example, provides for the injection of the switching signal into the line for receiving the magnetic resonance signals before the switching apparatus. Only the coil elements that are selected by the switching apparatus are supplied with the dynamic switching signal. Since the coil elements that have not been selected to receive do not receive a dynamic switching signal, a suitable circuit (e.g., the detuning module) that keeps these coil elements that have not been selected detuned (e.g., statically) during the transmit process is additionally provided.

The frequency multiplexing of the magnetic resonance receive signal and of the dynamic switching signal for the detuning assemblies (e.g., the PIN diodes) is achieved by way of corresponding diplexers. The switching signal has already been injected by way of the first diplexer before the switching apparatus, passes through the switching apparatus and the connecting line from the switching apparatus to the coil element, thus reaching the detuning assembly. In the counter direction, the magnetic resonance receive signal also passes through the connecting line and the switching apparatus and is separated from the switching signal at the first frequency multiplexer and fed to the data processing apparatus. The switching apparatus, which was provided originally for the assignment of coil elements to receive channels and may be activated, for example, by a register of the controller, therefore also takes over the function of selecting the PIN diodes and therefore coil elements to be detuned dynamically.

One embodiment thus allows significant simplification of the infrastructure outlay (e.g., with respect to the complexity of activation and the quantity of cabling and outlay thereon).

In one embodiment, at least one current and/or voltage source for generating a switching voltage and/or a switching current for the detuning assembly may be connected upstream of the first diplexer, so that the switching signal includes the switching voltage and/or the switching current. In this embodiment, the current and/or voltage source is therefore disposed clearly outside the examination volume (e.g., outside the receive coil), so that the switching voltage and/or the switching current may be injected as the switching signal directly by way of the first diplexer. In this example, a current and/or voltage source may not be integrated close to the coil element. Instead, the current and/or voltage source may be disposed outside, so that, for example, less heat is generated locally. This, however, has the disadvantage that the switches of the switching apparatus are to withstand the large current or the high voltage. This embodiment also includes a second diplexer on the coil element side to extract the switching signal used to switch the detuning assembly, isolating the switching signal close to the coil element. An amplifier (preamplifier, LNA) may be connected downstream of the actual coil element, which the switching signal may pass through in the counter direction.

In this embodiment, the detuning modules may each have a current and/or voltage source that, when there is no switching signal present, supplies a, for example, lower switching voltage or a, for example, smaller switching current to activate the detuning state. For the static detuning of coil elements not supplied with the switching signal by way of the switching apparatus, a current source or voltage source (e.g., a current source), as the detuning state may be achieved by the current, may be provided directly on the coil element. In one embodiment, a current source includes a voltage source and a pre-resistor to generate the current. The current is, for example, advantageously smaller than the current provided by the switching signal would be. For example a current of, for example, 5 mA may be achieved by a 10 V voltage source and a corresponding pre-resistor. This has the advantage that the current generated by the further current source is so small that, if a switching signal occurs and therefore a selection switch is closed, the current may be "overtuned" by the larger current and/or voltage source. Such an implementation by a current that is smaller than the current contained in the switching signal, is possible, for example, because the coil elements not selected to receive may be located outside the transmit field of the high-frequency transmit coil anyway, so a smaller current is sufficient.

In an alternative solution, the detuning modules may each have a converter for converting irradiated high-frequency energy to a switching voltage or switching current to activate the detuning state. For example, a circuit for rectifying injected high-frequency voltage that generates a direct current that allows detuning at the time of transmission may be provided. An additional voltage source or current source may not be provided, but there may be a short delay before enough current or voltage has been generated to achieve detuning.

In another embodiment, a current and/or voltage source for generating a switching voltage and/or a switching current for the detuning assembly may be provided in the receive coil for each coil element. The switching signal that may be extracted again by second diplexers on the coil element side for extracting the switching signal used to switch the detuning assembly may be a logic signal that may be interpreted by a switching device assigned to the current and/or voltage source. The switching device may, for example, also be integrated un the current and/or voltage source, which is therefore provided on the coil element side, so that the switching device may have, for example, a control input for the switching signal configured as a logic signal. In this embodiment, each coil element has its own, assigned, switchable current and/or voltage source, so that only a logic signal is to be carried by way of the switching apparatus, thereby reducing the requirements for the switching apparatus. In one embodiment, the switching apparatus may be configured as a microelectromechanical system (MEMS) relay.

In this switching in the receive coil embodiment, the detuning module may be implemented for a pull-up resistor to be connected as part of the detuning module upstream of the switching device integrated, for example, in the current and/or voltage source for each coil element. The pull-up resistor is thus used to switch the input of the switching device (e.g., a control input of the current and/or voltage source) to a state that switches the current and/or voltage source to the state that results in detuning (e.g., resulting in the current and/or voltage source conducting a suitable switching current through the detuning assembly so that the switching current is in the detuning state). A switching current may be generated based on the logic signal for the switching device generated by the detuning module to be smaller than a switching current resulting when a logic signal is supplied by way of the diplexers. In one embodiment, the current and/or voltage source may be switched to a current state with reduced current, as coil elements not selected to receive may be located outside the transmit field.

A number of receive coils may also include the coil elements to be switched or detuned. Therefore, the detuning apparatus is assigned to a number of receive coils.

In addition to the detuning apparatus, a magnetic resonance device may be provided. The magnetic resonance device may include at least one receive coil with an assigned detuning apparatus and the data processing apparatus. All statements relating to the detuning apparatus may be applied analogously to the magnetic resonance device, so that the advantages may also be achieved with the magnetic resonance device.

DETAILED DESCRIPTION OF THE DRAWINGS

Figure 1:
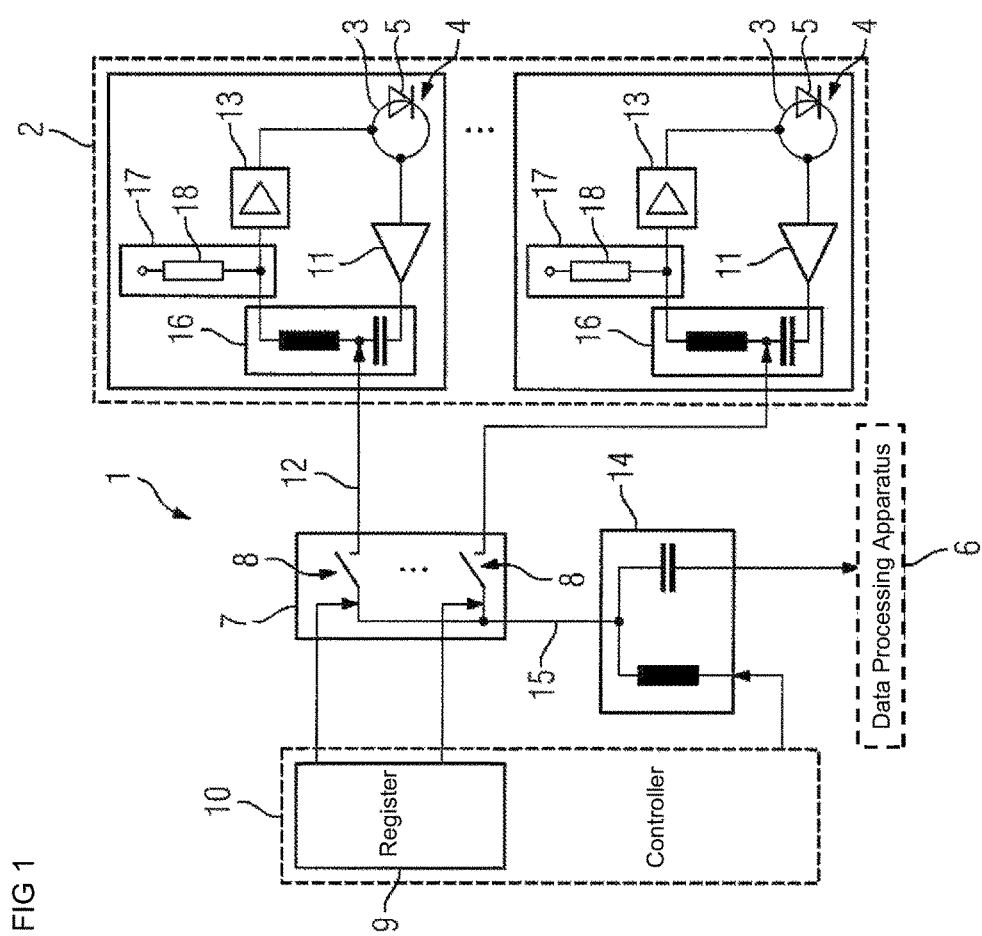
FIG. 1 shows one embodiment of a detuning apparatus.

FIG. 1 shows one embodiment of a detuning apparatus 1, as may be used in a magnetic resonance device having at least one receive coil 2. The receive coil 2 may be a local coil, for example. The receive coil 2 may include a number of coil elements 3 that receive magnetic resonance signals. Only two of the coil elements 3 are shown in FIG. 1 for purposes of simplicity. The coil elements 3 are switched during the transmit process by way of a transmit coil (not shown in detail in FIG. 1) such as, for example, a whole-body coil, to a non-resonant state (e.g., a detuning state), so that high-frequency energy is not injected in from the transmit signal. A detuning assembly 4 is provided on the coil element 3 for this purpose. The detuning assembly 4 is configured, for example, as a PIN diode 5.

Because of a current measurement (e.g., taken region by region) and/or because of the fact that only a certain number of receive channels are present, not all the coil elements 3 are connected permanently to a receive channel of a data processing apparatus 6 but may be assigned, as required, to a receive channel by way of a switching apparatus 7 (e.g., configured as a MEMS relay). The individual switches 8 of the switching apparatus 7 are controlled, for example, by way of a register 9 of a controller 10. The receive signal may therefore pass through an amplifier 11 and be supplied by way of a connecting line 12 and the switching apparatus 7 to the data processing apparatus 6 (e.g., an evaluation device). To allow the switching of the PIN diodes 5, each coil element 3 may be assigned a current and voltage source 13, by way of which a current (e.g., a current of 30 mA) may be generated to generate the detuning state. The current switches the PIN diode 5 to a very low resistance (e.g., 0.1 Ohm), thus providing the detuning of the coil element 3. If the coil element 3 is to be resonant, a negative switching voltage of, for example, −40 V is output by the current and voltage source 13, so that the PIN diode 5 has a higher resistance (e.g., blocks), and the coil element 3 is resonant and may receive. The current and voltage source 13 therefore is to be switched back and forth between the states by way of a suitable signal that is fed to the current and voltage source 13, or by a dedicated switching device (not shown in detail in FIG. 1) via a control input when the coil element 3 is to be detuned dynamically.

The corresponding switching signal, which is configured, for example, as a logic signal, is likewise supplied by the controller 10. According to one embodiment, the switching signal is likewise transported by way of the switching apparatus 7 and the connecting line 12, with a frequency multiplexing method being used for this purpose. Connected upstream of the switching apparatus 7 in the direction of the coil element 3 therefore is a diplexer 14 that injects the switching signal into the line 15 to the switching apparatus 7. Therefore, the switches 8 of the switching apparatus 7 also determine the coil elements 3, to which the dynamic switching signal is supplied. No further control signal is therefore required from the controller 10 to decide whether the current and voltage sources 13 are to respond to the switching signal, since these have already been selected by way of the switching apparatus 7. In one embodiment, a single cable connection is provided for each coil element 3 with the connecting line 12, thereby significantly reducing the complexity and cabling outlay. Provided on the coil element side is a second diplexer 16, via which the switching signal may be extracted and assigned to the current and voltage source 13.

In order to keep the coil elements 3 not selected to receive by way of the switching apparatus 7 statically detuned, a detuning module 17 is connected upstream of the control input of each current and voltage source 13. The detuning module includes, for example, a pull-up resistor 18 that takes the control input of the current and voltage source 13 to a state that switches the current and voltage source 13 to a current-supplying state. The current-supplying state supplies a smaller current than the current supplied when a switching signal is present. The current, however, is still reliably sufficient to detune the coil element 3 (e.g., when the coil element 3 is not located within the transmit field). A statically detuned state of the coil elements 3, for which no switching signal is forwarded, is thus achieved.

Figure 2:
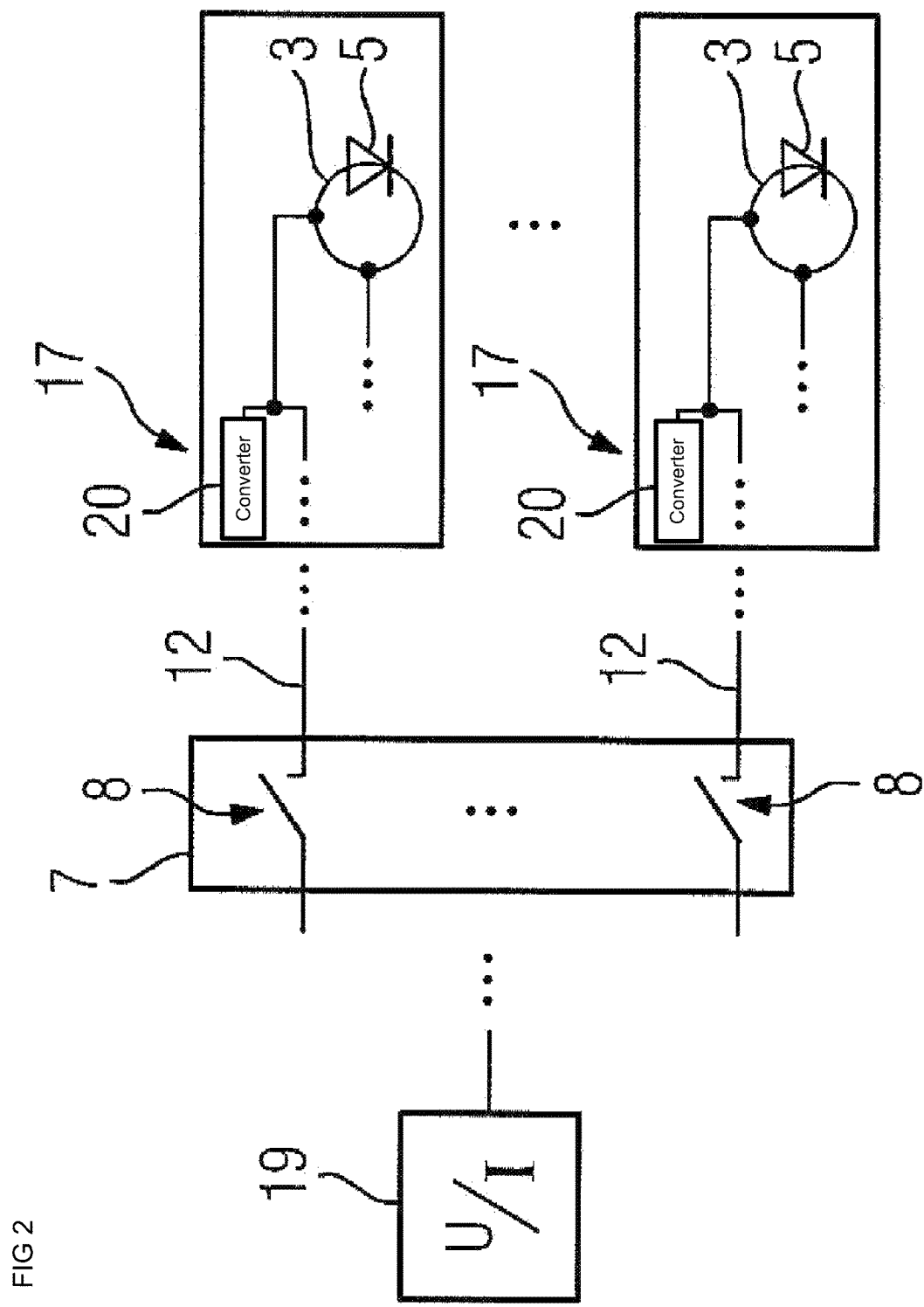
FIG. 2 shows components of one embodiment of a detuning apparatus.

FIG. 2 shows a simplified diagram of components of an embodiment of a detuning apparatus illustrating a current and voltage source 19 disposed outside the receive coil 2 (e.g., outside the entire examination volume). A single current and voltage source 19 may be provided for all lines assigned to receive channels, Each line assigned to a receive channel may be provided with its own current and voltage source 19. For example, either the switching voltage or the switching current is transported by way of the switching apparatus 7 and the lines 12 as the switching signal, for which reason the switches 8 are designed to withstand the switching current and the switching voltage. The switching signal passes through the line 12 and is decoupled again by a second diplexer 16.

To detune the coil elements 3 not selected to receive (e.g., not receiving any switching signal), the detuning module 17, for example, includes a converter 20 for converting irradiated high-frequency energy to a switching current to activate the detuning state of the PIN diodes 5.

Figure 3:
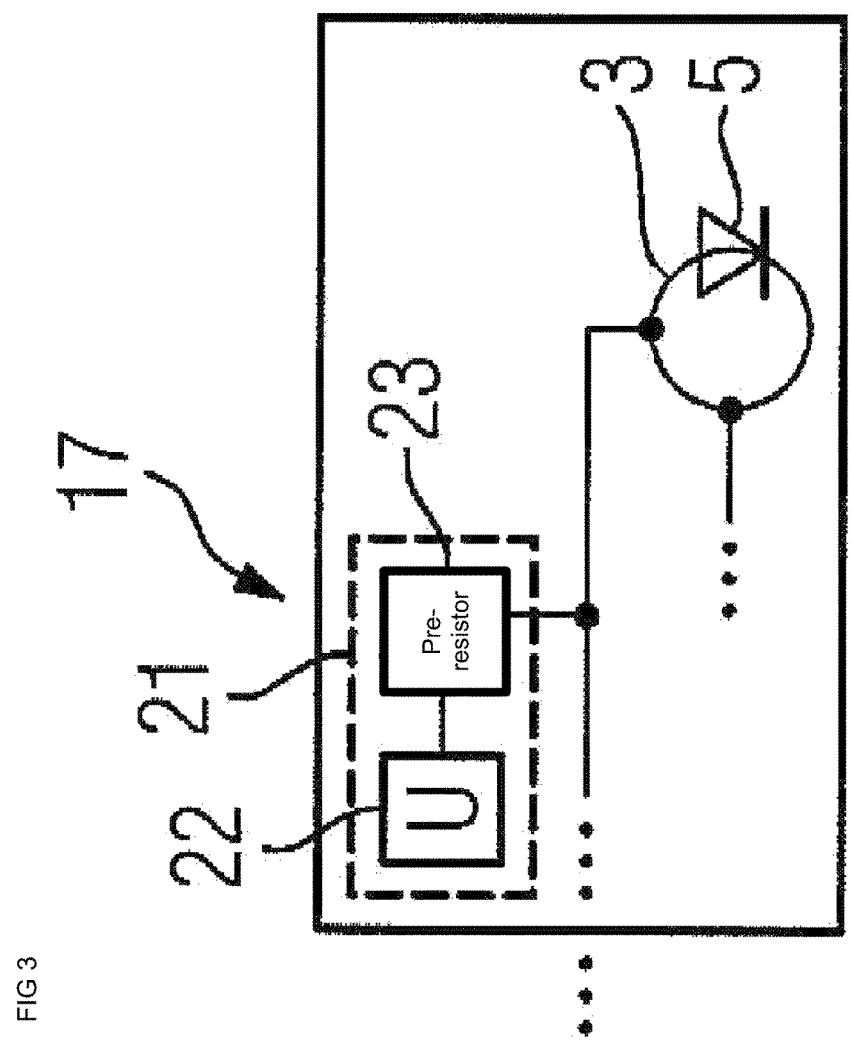
FIG. 3 shows a region of a coil element in one embodiment of a detuning apparatus.

FIG. 3 shows an alternative solution for the detuning module 17, with a current source 21 being provided for the static detuning of the coil element 3 (e.g., including a voltage source 22 and a pre-resistor 23). The current supplied by the current source 21 is, for example, smaller than the switching current supplied by the current and voltage source 19 (e.g., 5 mA), so that the coil element may be "overtuned" by a switching voltage supplied with the assigned switch 8 closed.

Figure 4:
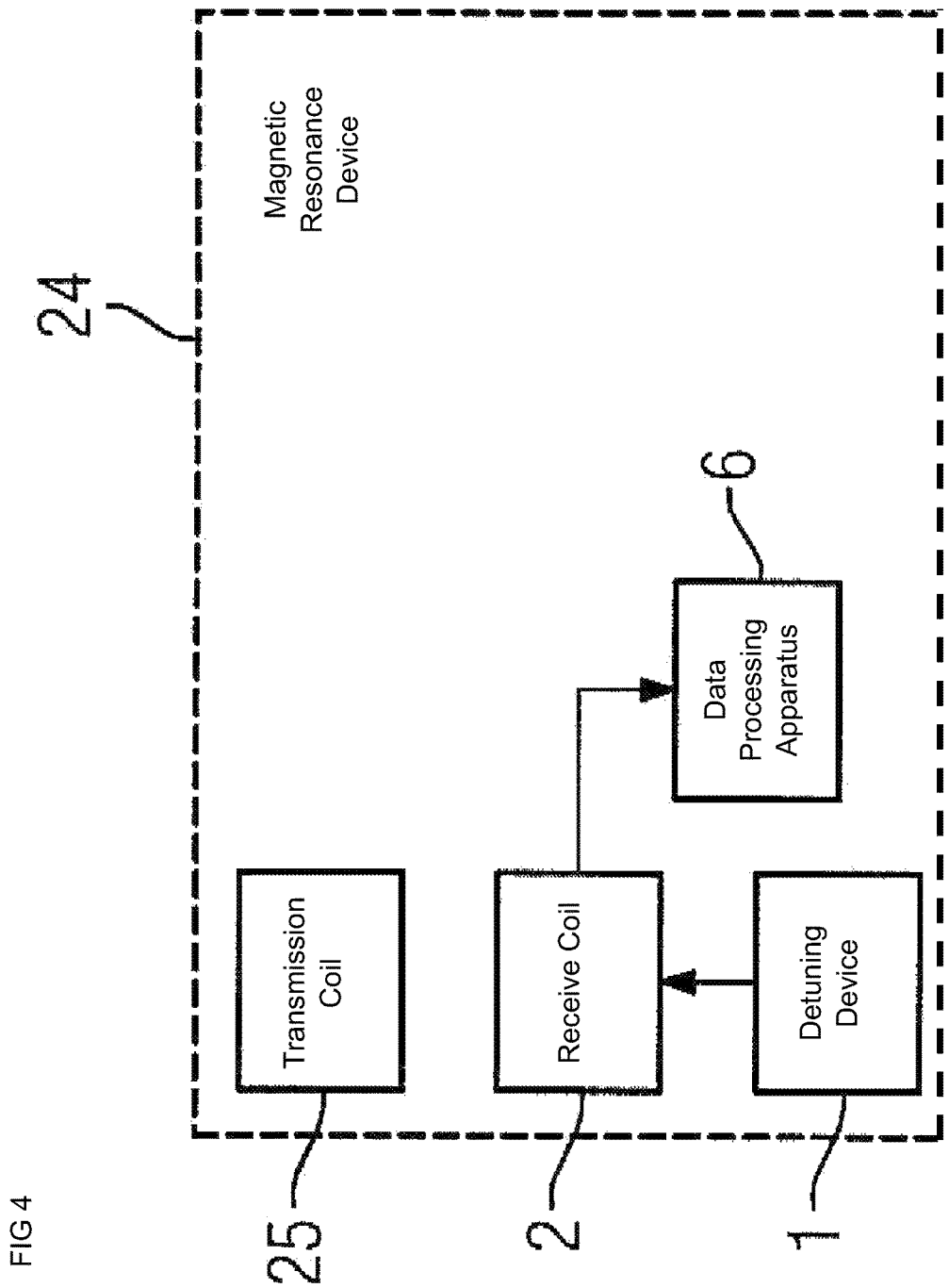
FIG. 4 shows one embodiment of a magnetic resonance facility.

FIG. 4 shows a simplified diagram of one embodiment of a magnetic resonance device 24 that includes a main magnet unit with a patient space, a gradient coil arrangement, a transmit coil 25 and the like. The magnetic resonance device 24 includes at least one receive coil 2 (e.g., configured as a local coil), to which one of the above described embodiments of a detuning device 1 is assigned. The receive signals from the receive coil 2 are processed by the data processing apparatus 6. The controller 10 may also be integrated into the general controller of the magnetic resonance device 24.

Even though the invention has been illustrated and described in detail using the exemplary embodiments, the invention is not restricted by the disclosed examples. Other variations may be derived therefrom by the person skilled in the art without departing from the scope of protection of the invention.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A detuning apparatus configured for a receive coil of a magnetic resonance device, the magnetic resonance device including a number of coil elements and a controller, each of the number of the coil elements being selectively connectable to a receive channel of a data processing apparatus by a switching apparatus, each of the number of coil elements including at least one detuning assembly that is switchable between a detuning state and a receive state by way of a continuous switching signal, the controller being operable to switch the switching apparatus and to generate the switching signals, the detuning apparatus comprising:
   first diplexers disposed outside of the number of coil elements, the first diplexers being connected upstream of the switching apparatus in a direction of the number of coil elements, the first diplexers being operable to inject switching signals that switch the at least one detuning assembly causing the number of coil elements to be detuned dynamically;
   second diplexers that are operable to extract the switching signals, the number of coil elements including the second diplexers, respectively; and
   detuning modules in communication with the number of coil elements, respectively, wherein the detuning modules operate to switch the at least one detuning assembly into the detuning state when no switching signal is injected by the first diplexers.

2. The detuning apparatus as claimed in claim 1, wherein the at least one detuning assembly of each of the number of coil elements comprises a PIN diode.

3. The detuning apparatus as claimed in claim 1, further comprising at least one current source, at least one voltage source, or at least one current and voltage source that are operable to generate a switching current, a switching voltage or a switching current and voltage respectively, for the at least one detuning assembly that is connected upstream of the first diplexer in a direction of the respective coil element, so that the switching signal comprises the switching voltage, the switching current, or the switching voltage and current.

4. The detuning apparatus as claimed in claim 3, wherein the detuning modules each have a current source, a voltage source, or a current and voltage source, and
   wherein when no switching signal is injected by the first diplexers, the detuning modules are operable and supply a lower switching voltage or a smaller switching current in order to activate the detuning state within the at least one detuning assembly.

5. The detuning apparatus as claimed in claim 3, wherein the detuning modules each have a controller configured to convert irradiated high-frequency energy into either a switching voltage or a switching current in order to activate the detuning state of the at least one detuning assembly.

6. The detuning apparatus as claimed in claim 1, wherein a current source, a voltage source, or a current and voltage source that is configured to generate a switching current, a switching voltage, or the switching current, and the switching voltage, respectively, for the at least one detuning assembly, is provided within the receive coil for each of the number of coil elements, and
   wherein the switching signal which is extractable by the second diplexers on a coil element side for extracting the switching signal used to switch the at least one detuning assembly, comprises a logic signal that is interpretable by a switching device assigned to the current source, the voltage source, or the current and voltage source.

7. The detuning apparatus as claimed in claim 6, wherein the switching apparatus is configured as a MEMS relay.

8. The detuning apparatus as claimed in claim 6, wherein at least one of the detuning modules comprises a pull-up resistor connected as part of the at least one detuning module the pull-up resister being upstream of the switching device and being integrated in the current source, the voltage source, or the current and voltage source for each of the number of coil elements.

9. The detuning apparatus as claimed in claim 8, wherein a switching current resulting from a logic signal generated by at least one of the detuning modules is smaller than a switching current that results when a logic signal is supplied by way of the first diplexers, the second diplexers, or the first diplexers and the second diplexers.

10. The detuning apparatus as claimed in claim 7, wherein at least one of the detuning modules comprises a pull-up resistor, the pull-up resister being connected as part of the at least one detuning module upstream of the switching device integrated in the current source, the voltage source, or the current and voltage source for each of the number of coil elements.

11. A magnetic resonance device comprising:
   a controller;
   at least one receive coil comprising:
      a number of coil elements, the number of coil elements being selectively connectable to a receive channel of a data processing apparatus by a switching apparatus, each of the number of coil elements including at least one detuning assembly that is switchable between a detuning state and a receive state by a continuous switching signal, and the controller being operable to switch the switching apparatus and generate the switching signals;

an assigned detuning apparatus comprising:

first diplexers disposed outside the number of coil elements, the first diplexers being connected upstream of the switching apparatus in a direction of the number of coil elements, the first diplexers being operable to inject switching signals that switch the detuning assembly and cause the number of coil elements to be detuned dynamically;

second diplexers that are operable to extract the switching signals, with the number of coil elements including the second diplexers, respectively; and detuning modules in communication with the number of coil elements, respectively, wherein each of the detuning modules operates to switch the at least one detuning assembly into the detuning state when no switching signal is injected by the first diplexers; and the data processing apparatus having the receive channel.

12. The magnetic resonance apparatus as claimed in claim 11, wherein the at least one detuning assembly of each of the number of coil elements comprises a PIN diode.

13. The magnetic resonance apparatus as claimed in claim 11, wherein the assigned detuning apparatus further comprises:

at least one current source, at least one voltage source, or at least one current and voltage source that is operable to generate a switching current, a switching voltage or a switching current and voltage respectively, for the at least one detuning assembly that is connected upstream of the first diplexer in a direction of the respective coil element, so that the switching signal comprises the switching voltage, the switching current, or the switching voltage and current.

14. The magnetic resonance apparatus as claimed in claim 13, wherein the detuning modules each have a current source, a voltage source, or a current and voltage source, and wherein when no switching signal is injected by the first diplexers, the detuning modules are operable and supply a lower switching voltage or a smaller switching current in order to activate the detuning state of the at least one detuning assembly.

15. The magnetic resonance apparatus as claimed in claim 13, wherein the detuning modules each have a controller that is configured to convert irradiated high-frequency energy into either a switching voltage or a switching current in order to activate the detuning state of the at least one detuning assembly.

16. The magnetic resonance apparatus as claimed in claim 11, wherein a current source, a voltage source, or a current and voltage source configured to generate a switching current, a switching voltage, or the switching current, and the switching voltage, respectively, for the at least one detuning assembly, is provided within the receive coil for each of the number of coil elements, and wherein the switching signal which is extractable by the second diplexers on a coil element side for extracting the switching signal used to switch the at least one detuning assembly, comprises a logic signal that is interpretable by a switching device assigned to the current source, the voltage source, or the current and voltage source.

17. The magnetic resonance apparatus as claimed in claim 16, wherein the switching apparatus is configured as a MEMS relay.

18. The magnetic resonance apparatus as claimed in claim 16, wherein the at least one of the detuning modules comprises a pull-up resistor connected as part of the at least one detuning module the pull-up resister being upstream of the switching device and integrated in the current source, the voltage source, or the current and voltage source for each of the number of coil elements.

19. The magnetic resonance apparatus as claimed in claim 18, wherein a switching current resulting from a logic signal generated by at least one of the detuning modules is smaller than a switching current that results when a logic signal is supplied by way of the first diplexers, the second diplexers, or the first diplexers and the second diplexers.

20. The magnetic resonance apparatus as claimed in claim 17, wherein at least one of the detuning modules comprises a pull-up resistor, the pull-up resister being connected as part of the at least one detuning module upstream of the switching device integrated in the current source, the voltage source, or the current and voltage source for each of the number of coil elements.

* * * * *